United States Patent [19]
Merritt

[11] Patent Number: 6,104,643
[45] Date of Patent: Aug. 15, 2000

[54] INTEGRATED CIRCUIT CLOCK INPUT BUFFER

[75] Inventor: Todd A. Merritt, Boise, Id.

[73] Assignee: Micron Technology, Inc., Boise, Id.

[21] Appl. No.: 09/371,297

[22] Filed: Aug. 10, 1999

Related U.S. Application Data

[63] Continuation of application No. 09/109,632, Jul. 2, 1998, Pat. No. 5,936,893, which is a continuation of application No. 08/832,437, Apr. 3, 1997, Pat. No. 5,812,462.

[51] Int. Cl.[7] .................................................. G11C 7/00
[52] U.S. Cl. ........................... 365/189.05; 365/189.08; 365/233; 326/93; 326/98
[58] Field of Search ....................... 365/189.05, 189.08, 365/233; 326/22, 31, 93, 97, 98

[56] References Cited

U.S. PATENT DOCUMENTS

| | | | |
|---|---|---|---|
| 4,958,088 | 9/1990 | Farah-Bakhsh et al. | 307/443 |
| 5,275,035 | 1/1994 | Baer | 73/1 R |
| 5,278,466 | 1/1994 | Honoa et al. | 307/480 |
| 5,341,045 | 8/1994 | Almulla | 307/475 |
| 5,349,566 | 9/1994 | Merritt et al. | 365/233.5 |
| 5,361,002 | 11/1994 | Casper | 327/530 |
| 5,539,337 | 7/1996 | Taylor et al. | 326/94 |
| 5,578,941 | 11/1996 | Sher et al. | 326/34 |
| 5,608,687 | 3/1997 | Komarek et al. | 365/233.5 |
| 5,612,630 | 3/1997 | Wright et al. | 326/22 |

*Primary Examiner*—Vu A. Le
*Attorney, Agent, or Firm*—Schwegman, Lundberg, Woessner & Kluth, P.A.

[57] ABSTRACT

An integrated circuit clock buffer is described which includes output circuits for generating internal clock signals in response to an externally provided clock signal. The clock buffer includes a latch circuit having a delayed feedback to provide a pulsed signal in response to a transition in the external clock signal. The output circuits have a trip point which is skewed in one direction to detect a rising transition of the pulsed signal, and are skewed in a second direction to detect a falling transition of the pulsed signal. The buffer generates two non-skewed internal clock signals which have sharp rising and falling transitions.

28 Claims, 5 Drawing Sheets

INTEGRATED CIRCUIT CLOCK INPUT BUFFER

This application is a continuation of U.S. Ser. No. 09/109,632 filed Jul. 2, 1998, now U.S. Pat. No. 5,936,893 which is a continuation of U.S. Ser. No. 08/832,437 filed Apr. 3, 1997 now U.S. Pat. No. 5,812,462.

TECHNICAL FIELD OF THE INVENTION

The present invention relates generally to integrated circuits and in particular the present invention relates to clock input buffer circuits.

BACKGROUND OF THE INVENTION

Synchronous integrated circuits operate according to an externally supplied clock signal. Internal circuit functions are performed in response to transitions of the clock signal. A detection circuit, or buffer, is typically provided to monitor the clock input signal and produce an output signal indicating the detection of a transition in the clock signal. These detection circuits can also produce complimentary output signals where one signal follows the clock signal, and the second signal follows the inverse of the clock signal.

Typical detection circuitry does not provide a means for quickly detecting both rising and filling transitions in an input clock signal. For example, the detection circuit may have a trip point adjusted to quickly detect a rising transition, but the detection of the falling transition will be offset by an equal amount in the opposite direction. The output signal(s) of the detection circuit, therefore, will be delayed in one signal transition. Further, where the buffer circuit produces complimentary output signals, the output signals are susceptible to skew. As such, circuitry operating in response to the output signals may require a buffer circuit to reduce the effects of the signal skew.

For the reasons stated above, and for other reasons stated below which will become apparent to those skilled in the art upon reading and understanding the present specification, there is a need in the art for a detection circuit which quickly detects transitions in an input clock signal and reduces signal skew between output signals.

SUMMARY OF THE INVENTION

The above mentioned problems with detecting clock signal transitions and other problems are addressed by the present invention and which will be understood by reading and studying the following specification. An input buffer is described which has adjusted trip points.

In particular, the present invention describes an integrated circuit clock buffer comprising an input for receiving an external clock signal, and a latch circuit coupled to the input. The latch circuit has an output node for providing a latch signal in response to the external clock signal. The buffer further includes an output circuit connected to the output node. The output circuit generates an internal clock signal in response to the latch signal, and has a first trip point when the latch signal is in a first state, and a second trip point when the latch signal is in a second state.

In another embodiment of the present invention, a synchronous memory device is described which comprises an array of memory cells, a clock input for receiving a clock signal, and a clock input buffer. The clock input buffer includes a latch circuit having first and second inputs, and first and second intermediate outputs. The first input is coupled to the clock input. A delay circuit is connected between the first intermediate output and the second input. The buffer includes a first output circuit coupled to the first intermediate output and the delay circuit for producing a first output signal. The first output circuit has a first trip point when a first intermediate output signal is in a first state, and a second trip point when a first intermediate output signal is in a second state. The buffer circuit further includes a second output circuit coupled to the second intermediate output and the delay circuit for producing a second output signal. The second output circuit has a first trip point when a second intermediate output signal is in a first state, and a second trip point when a second intermediate output signal is in a second state.

In yet another embodiment, a method of generating an internal clock signal in an integrated circuit is described. The method comprises the steps of receiving an externally provided clock signal, and latching a first transition of the externally provided clock signal. The internal clock signal is transitioned in response to the latched first transition through an output circuit having an initial trip point adjusted to detect the latched first transition. The method further comprised adjusting the initial trip point following a predetermined time period to detect a second transition of the externally provided clock signal, latching a second transition of the externally provided clock signal, and transitioning the internal clock signal in response to the latched second transition.

BRIEF DESCRIPTION OF THE DRAWINGS

FIG. 2b is a timing diagram of the circuit of FIG. 2a;

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
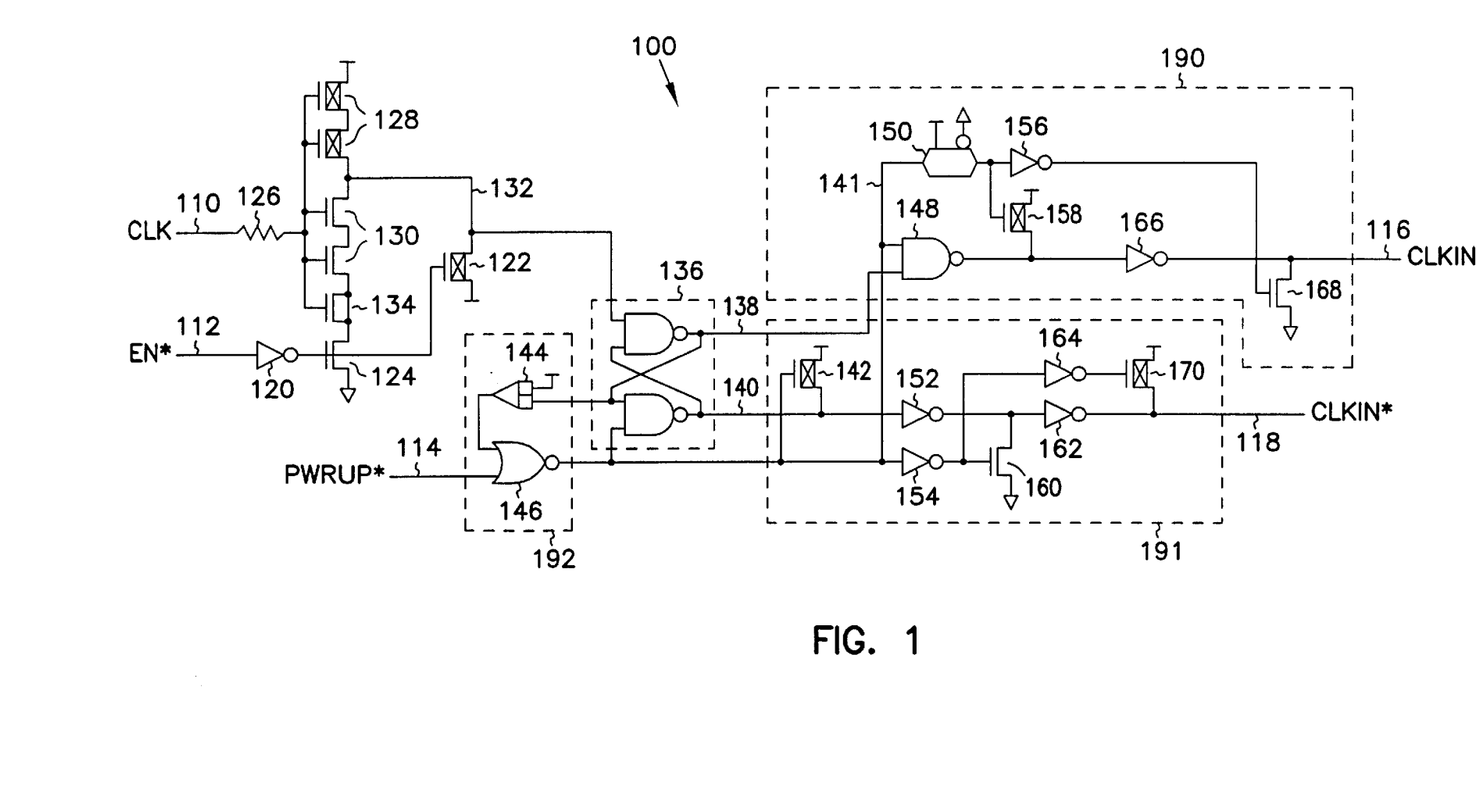
FIG. 1 is a schematic diagram of a buffer circuit incorporating the present invention.

Referring to FIG. 1 a clock signal buffer circuit 100 according to the present invention is described. The buffer receives a clock input signal (CLK) at node 110, an enable input signal (EN*) at node 112, and a power up input signal (PWRUP*) at node 114, and produces output signals CLKIN at node 116, and CLKIN* at node 118. When the enable signal, EN*, is in a high state, the output of inverter 120 activates p-channel transistor 122. The buffer circuit 100 will not respond to transitions of the clock input signal when transistor 122 is activated. Further, N-channel transistor 124 is activated when the EN* signal is in a low state.

P-channel transistors 128 and n-channel transistors 130 are activated in response to the clock input signal, CLK. When CLK is in a low state, p-channel transistors 128 are activated and pull node 132 high. When CLK is in a high state, n-channel transistors 130 are activated and pull node 132 low, provided transistor 124 is activated.

Figure 2A:
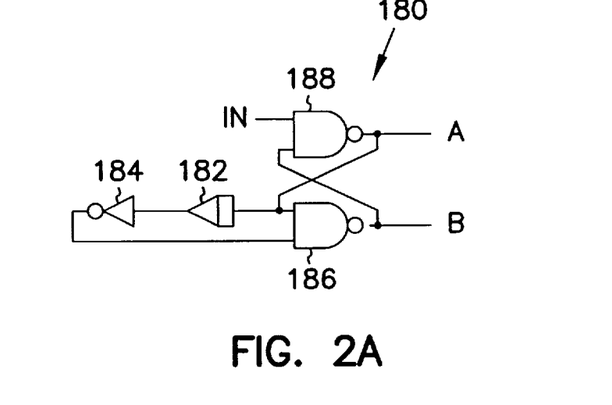
FIG. 2a is a schematic diagram of a one shot latch circuit.
Figure 2B:
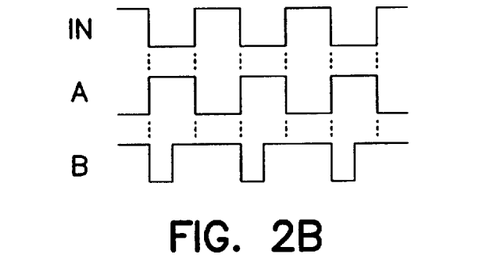

Prior to describing the operation of the circuit of FIG. 1, a one-shot latch circuit 180 is described with reference to FIGS. 2a and 2b. The latch has an input node (IN), and output nodes A and B. A delay element 182 and an inverter 184 are coupled between the inputs of NAND gate 186. As shown in FIG. 2b, when the IN signal transitions low, output A transitions high and output B transitions low. Output B remains low for the length of delay element 182 and then transitions to a high state. Thus, output A follows the inverse of the IN signal and output B provides a low pulse in response to a low transition in the IN signal.

Figure 3:
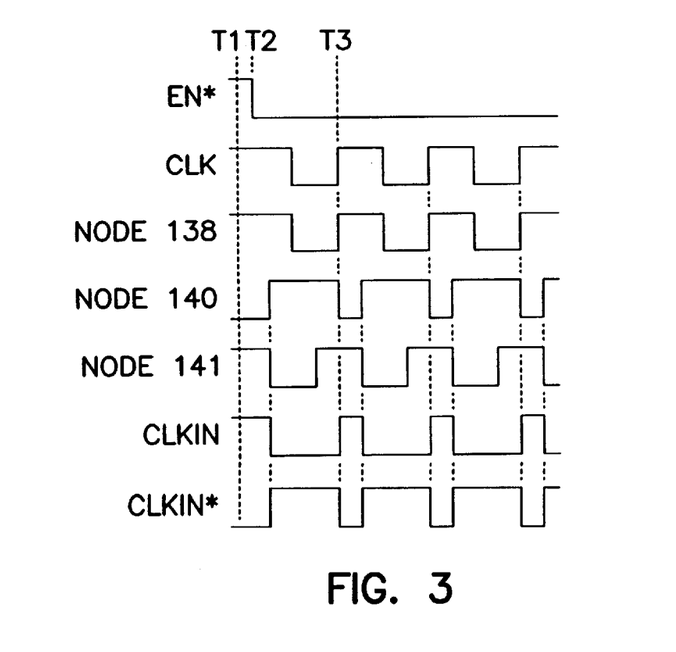
FIG. 3 is a timing diagram of the circuit of FIG. 1.

The buffer circuit of FIG. 1 is best understood with reference to the timing diagram of FIG. 3. At time T1 the enable signal, EN*, is high. Thus, node 132 is held high regardless of transitions in the clock signal, CLK. At time 12, EN* transitions low and transistor 122 is turned off. Node 132 thereafter follows the inverse of the CLK signal through transistors 128 and 130. At time T3, node 138 transitions to a high state in response to node 132 transitioning low. The output of NOR gate 146, node 141, transitions to a low state in response to node 138. Delay element 144 is provided to delay the transition of node 141 in response to a high signal transition on node 138. The delay time of element 144 is preferably about 3 nano seconds, but can be varied without departing from the present invention. It will be understood that latch 136, delay 144 and NOR gate 146 operate similar to the circuit of FIG. 2a, as described above. Thus, the signal on node 138 follows the clock signal 110, and the signal on node 140 pulses low when the clock input signal transitions to a high state. The output of NOR gate 146, node 141, follows the signal on node 138, but is offset by the length of time delay circuit 144.

Inverter circuit 152 is fabricated with an N to P ratio to allow a quick response to a falling input signal. That is, the beta (p) ratio of the inverter is adjusted so that a trip point of the inverter is above a mid-level voltage, such as ½ the supply voltage (Vcc). A nominal beta ratio (P/N) for an inverter is 1.5. Selecting a nominal beta ratio allows the detection of rising and falling signals to be substantially equal. The preferred Beta ratio for inverter 152 is about 3. Inverter 162 is fabricated with an N to P ratio to allow a quick response to a rising input signal. That is, the beta ($\beta$) ratio of the inverter is adjusted so that a trip point of the inverter is below a mid-level voltage. The preferred Beta ratio for inverter 162 is about 0.5. By skewing the trip point to detect rising transitions more quickly, the detection of falling signal transition will require more time.

With the beta ratios of inverters 152 and 162 adjusted for fast responses to rising and falling input signals, respectively, a falling signal on node 140 is quickly provided on node 118, CLKIN*. After a time delay from circuit 144, node 141 transitions to a low state in response to a high transition of a signal on node 138. Transistors 142, 160, and 170 are activated in response to a low transition of node 141. Output 118 transitions to a high state in response to transistors 142, 160, and 170. It will be appreciated by those skilled in the art that the beta ratios of inverters 152 and 162 for pulling the output signal CLKIN* high are enhanced by transistors 142, 160, and 170. Thus, CLKIN* is skewed by inverters 152 and 162 to quickly drive the output signal low, and is skewed by transistors 142, 160, and 170, after a time delay, to quickly drive the output signal high. The rising and falling edges of CLKIN*, therefore, are tailored to be very sharp and eliminate clock skew between CLKIN and CLKIN*, as illustrated in FIG. 3.

Output signal CLKIN provided on node 116 is produced using NAND gate 148 and inverter 166. The beta ratio of inverter 166 is adjusted such that it has a quick response to a falling input signal. That is, the beta ($\beta$) ratio of the inverter is adjusted so that a trip point of the inverter is above a mid-level voltage, such as ½ the supply voltage (Vcc). As stated above, a nominal beta ratio (P/N) for an inverter is 1.5 such that the inverter switches on and off evenly. The preferred Beta ratio for inverter 166 is about 5. However, it will be appreciated that NAND gate 148 and inverter 166 are adjusted so that the rising edge of the CLKIN signal matches the falling edge of the CLKIN* signal. The signal on node 141 is used to activate transistors 158 and 168 to pull node 116 low. Multiplex circuit 150 is provided as a gate delay and is fabricated to match the gate delay of inverter 154. Other circuitry can be substituted for multiplex circuit 150 so that p-channel transistor 158 and n-channel transistor 160 are activated at the same time.

It will be appreciated by those skilled in the art that the beta ratio of inverter 166 for pulling the output signal CLKIN low is enhanced by transistors 158 and 168. Thus, CLKIN is skewed by inverter 166 to quickly drive the output signal high, and is skewed by transistors 158 and 168, after a time delay, to quickly drive the output signal low. The rising and falling edges of CLKIN, therefore, are tailored to be very sharp and eliminate clock skew between CLKIN and CLKIN*. The buffer of FIG. 1, therefore, includes an input 110 for receiving a clock signal, a latch circuit 136 having a delayed feedback circuit 192, and output circuits 190 and 191 which have adjustable trip points to quickly detect both rising and falling output signals from the latch circuit.

Figure 4:
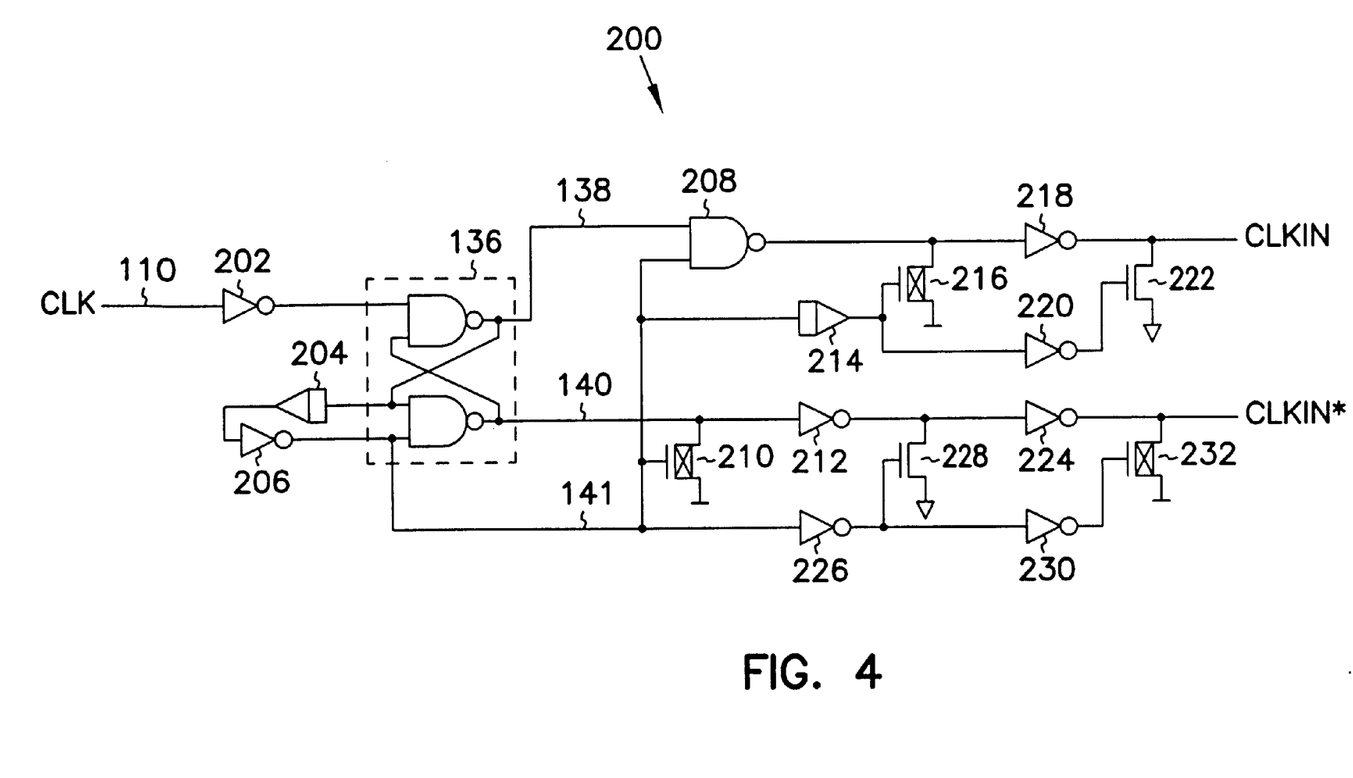
FIG. 4 is a schematic diagram of another buffer circuit incorporating the present invention.

FIG. 4 is an alternate buffer circuit 200 incorporating the present invention. The buffer circuit receives a clock signal (CLK) at node 110 and latches the signal in latch 136 through inverter 202. The latch 136 operates similar to the circuit described above with reference to FIGS. 2a and 2b. Thus, delay element 204 and inverter 206 provide a delayed feedback circuit. The buffer circuit functions according to the timing diagram of FIG. 3, described above. Those skilled in the art will appreciate that the enable circuitry 112, 120, 124, and 122 has been eliminated in the embodiment of FIG. 4, but can be added to allow the latch circuit 136 to be enabled and disabled. Further, the power-up feature of the buffer circuit of FIG. 1 has been eliminated, but could be added for example by providing an enable circuit to inverter 206. Inverters 212, 218, and 224 are fabricated to have beta ratios adjusted for a quick detection of one transition direction of the output nodes of latch 136. That is, inverter 218 is fabricated with a beta ratio to quickly detect a falling transition on the output of NAND gate 208 (rising transition of node 138). Likewise, inverter 212 is fabricated to quickly detect a falling transition on node 140, and inverter 224 is fabricated to quickly detect a rising input signal. As described above, transistors 210, 216, and 228 are provided to effectively change the beta ratios of the inverters for a quick detection of an opposite transition. Thus, when transistor 216 is activated, inverter 218 will provide a low output signal on CLKIN faster than if the output of NAND gate 208 transitioned high. The CLKIN and CLKIN* signals, therefore, have sharp rising and falling transitions, are aligned with minimum skew, and are transition in response to transitions in CLK faster than conventional buffer circuits.

Figure 6:
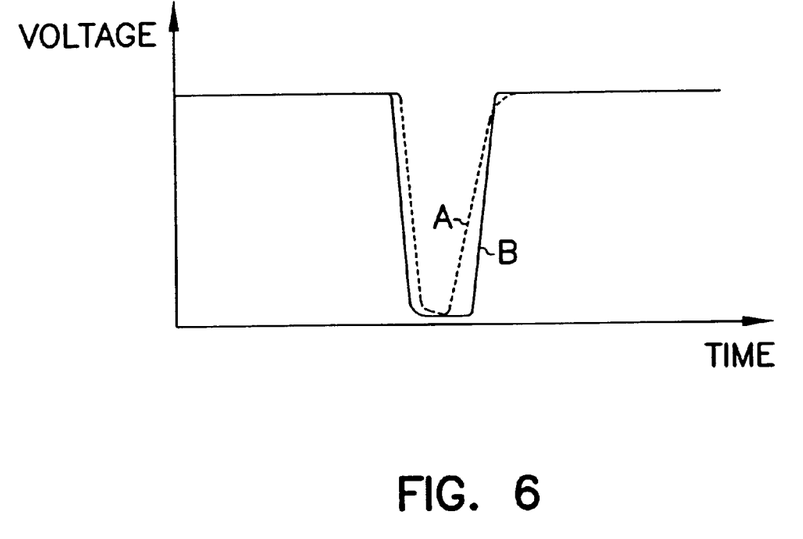
FIG. 6 is a graphical comparison of a clock signal of the present invention verses a conventional clock signal.

FIG. 6 is a graphical comparison of CLKIN* signal (signal B) generated using the present invention, and clock signal A generated using a conventional clock buffer circuit. It will be appreciated by those skilled in the art that the clock signal is shaped for less clock skew, and has pulse width flexibility.

Figure 5:
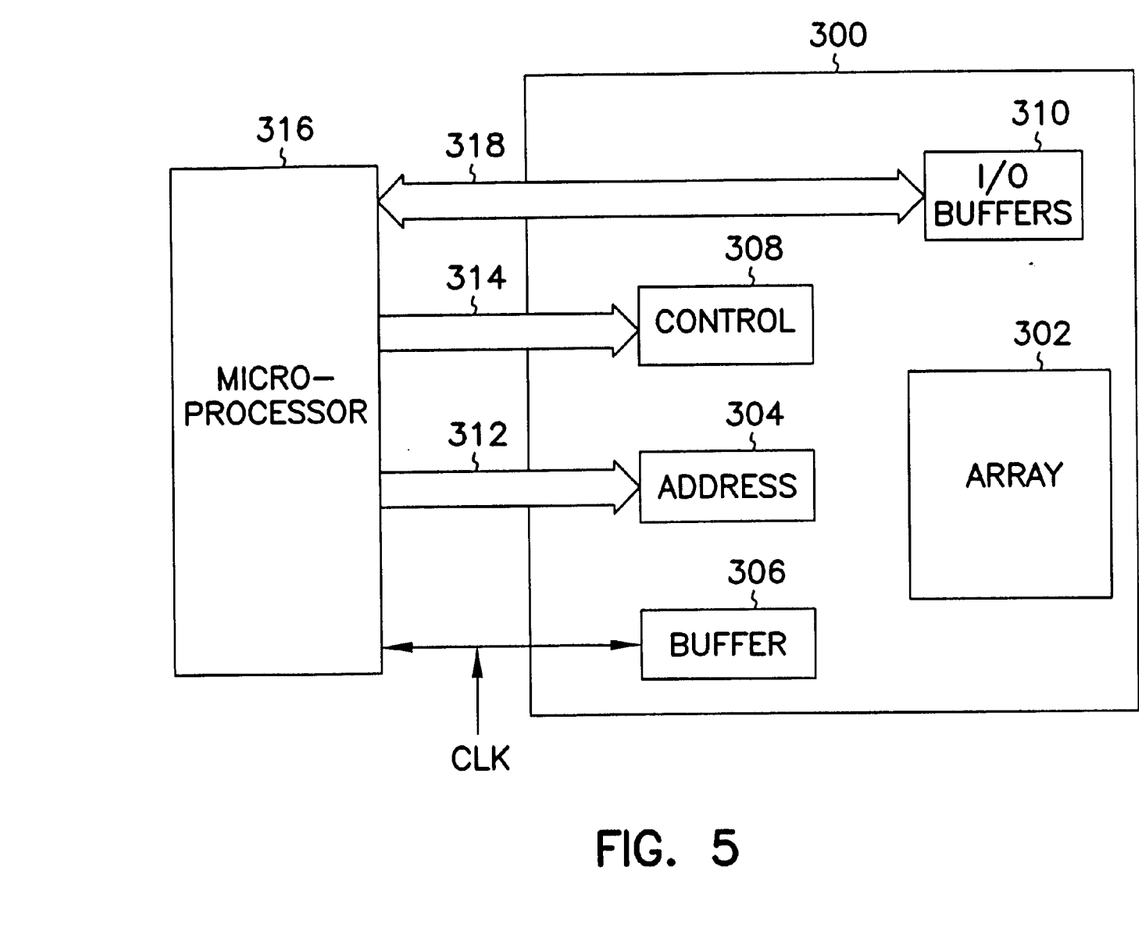
FIG. 5 is a block diagram of a synchronous memory device incorporating the present invention.

The above described clock input buffers are particularly useful in an integrated memory circuit. In particular, the input buffer is useful in synchronous memory devices such as a synchronous dynamic random access memory (SDRAM). A simplified block diagram of an SDRAM 300 is illustrated in FIG. 5. The SDRAM includes an array of memory cells 302, address circuitry 304 for addressing the memory array, a clock input buffer 306 for receiving a clock signal (CLK), and control circuitry 308 for controlling the operation of the memory device. The clock input buffer 306 includes the circuitry described above for reducing clock skew. Input/output (I/O) buffer circuitry 310 is provided for data input and output. An external processor 316 is typically used to provide control signals on lines 314, address signals on lines 312, and transmit and receive data on lines 318. It will be appreciated by those skilled in the art that the SDRAM of FIG. 5 is simplified to illustrate the present invention and is not intended to be a detailed description of all of the features of an SDRAM.

The address circuitry of a typical SDRAM includes an address buffer which is used to latch an address provided on the address lines 312. The address buffer would typically include a delay circuit which delays the address while the clock input buffer processes the clock signal and generates internal clock signals. This delay is primarily necessary due to skew between internal clock signals. It will be appreciated, therefore, that by reducing or eliminating internal clock skew by incorporating the clock buffer described above, the delay provided in the address buffer can be reduced or eliminated. Thus, an address provided on the external address inputs can ripple into the memory faster.

Conclusion

An input clock buffer circuit is described which processes an input clock signal and produces internal clock signals. The buffer circuit includes a latch circuit connected to output devices. The trip points of the output devices are skewed in one direction when the latch is in a first state, and skewed in the other direction when the latch is in a second state. The latch circuit is fabricated as a one shot latch using a delay element to reset the latch. The buffer circuit is particularly useful in synchronous memory devices such as SDRAMs.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A buffer circuit comprising:
an input node for receiving a clock signal;
a controllable inverter circuit coupled to the input node, the controllable inverter circuit provides an output signal in response to the clock signal when an enable signal is in a first state, and the controllable inverter circuit is disabled when the enable signal is in a second state;
a one-shot latch circuit comprising,
a latch circuit comprising a first input node coupled to an output node of the controllable inverter circuit, a second input node, and first and second output nodes,
a delayed feedback circuit coupled between the first output node of the latch circuit and the second input node of the latch circuit;
a first output circuit coupled to the first output node of the latch circuit; and
a second output circuit coupled to the second output node of the latch circuit, the first and second output circuits have adjustable trip points to quickly detect both rising and falling output signals provided on the first and second output nodes of the latch circuit.

2. The buffer circuit of claim 1 wherein the latch circuit comprises a pair of cross-coupled NAND gates.

3. The buffer circuit of claim 2 wherein the delayed feedback circuit comprises:
a delay element having an input node coupled to the first output node of the latch circuit; and
an inverting logic gate having an input node coupled to an output node of the delay element, an output node of the inverting logic gate is coupled to the second input node of the latch circuit.

4. The buffer circuit of claim 3 wherein the inverting logic gate is a NOR gate.

5. The buffer circuit of claim 1 wherein the controllable inverter circuit comprises:
p-channel pull-up transistors; and
n-channel pull-down transistors coupled in series with the p-channel pull-up transistors, at least one of the p-channel pull-up transistors or n-channel pull-down transistors is selectively activated in response to the enable signal.

6. The buffer circuit of claim 5 wherein the controllable inverter circuit further comprises a disable transistor coupled to the first input node of the latch circuit, the disable transistor is selectively activated in response to the enable signal.

7. The buffer circuit of claim 1 wherein the first output circuit comprises output inverter circuitry that has an adjustable p-type to n-type beta ratio to establish a trip point for the first output circuit.

8. The buffer circuit of claim 7 wherein the first output circuit comprises:
a p-channel pull-up transistor coupled to an input node of the output inverter circuitry; and
an n-channel pull-down transistor coupled to an output node of the output inverter circuitry, the p-channel pull-up transistor and the n-channel pull-down transistor can be selectively activated to adjust the p-type to n-type beta ratio of the output inverter circuitry.

9. The buffer circuit of claim 1 herein the second output circuit comprises output inverter circuitry that has an adjustable p-type to n-type beta ratio to establish a trip point for the first output circuit.

10. The buffer circuit of claim 9 wherein the first output circuit comprises:
a p-channel pull-up transistor coupled to an output node of the output inverter circuitry; and
an n-channel pull-down transistor coupled to an input node of the output inverter circuitry, the p-channel pull-up transistor and the n-channel pull-down transistor can be selectively activated to adjust the p-type to n-type beta ratio of the inverter circuitry.

11. The buffer circuit of claim 1 wherein the second output circuit comprises first and second series connected output inverters.

12. The buffer circuit of claim 11 wherein the first output circuit comprises:

a first p-channel pull-up transistor coupled to an input node of the first output inverter;

an n-channel pull-down transistor coupled to an output node of the first output inverter; and a second p-channel pull-up transistor coupled to an output node of the second output inverter, the p-channel pull-up transistors and the n-channel pull-down transistor can be selectively activated to adjust a p-type to n-type beta ratio of the second output circuit.

13. A buffer circuit comprising:

an input node for receiving a clock signal;

a controllable inverter circuit coupled to the input node, the controllable inverter circuit provides an output signal in response to the clock signal when an enable signal is in a first state, and the controllable inverter circuit is disabled when the enable signal is in a second state;

a one-shot latch circuit comprising,
a latch circuit comprising a first input node coupled to an output node of the controllable inverter circuit, a second input node, and first and second output nodes,
a delayed feedback circuit coupled between the first output node of the latch circuit and the second input node of the latch circuit;

a first output circuit coupled to the first output node of the latch circuit, the first output circuit comprises first output inverter circuitry, a first p-channel pull-up transistor coupled to an input node of the first output inverter circuitry, and a first n-channel pull-down transistor coupled to an output node of the first output inverter circuitry, the first p-channel pull-up transistor and the first n-channel pull-down transistor can be selectively activated to adjust a p-type to n-type beta ratio of the first output inverter circuitry; and a second output circuit coupled to the second output node of the latch circuit, the second output circuit comprises second output inverter circuitry, a second p-channel pull-up transistor coupled to an output node of the second output inverter circuitry, and a second n-channel pull-down transistor coupled to an input node of the second output inverter circuitry, the second p-channel pull-up transistor and the second n-channel pull-down transistor can be selectively activated to adjust a p-type to n-type beta ratio of the second output inverter circuitry.

14. The buffer circuit of claim 13 wherein the delay feedback circuit comprises a series coupled delay element and an inverter circuit.

15. The buffer circuit of claim 13 wherein the first and second p-channel pull-up transistors and the first and second n-channel pull-down transistors are selectively activated in response to the second input node of the latch circuit.

16. A buffer circuit comprising:

an input node for receiving a clock signal;

a controllable inverter circuit coupled to the input node, the controllable inverter circuit provides an output signal in response to the clock signal when an enable signal is in a first state, and the controllable inverter circuit is disabled when the enable signal is in a second state;

a one-shot latch circuit comprising,
a latch circuit comprising a first input node coupled to an output node of the controllable inverter circuit, a second input node, and first and second output nodes,
a delayed feedback circuit coupled between the first output node of the latch circuit and the second input node of the latch circuit;

a first output circuit coupled to the first output node of the latch circuit, the first output circuit comprises first output inverter circuitry, a first p-channel pull-up transistor coupled to an input node of the first output inverter circuitry, and a first n-channel pull-down transistor coupled to an output node of the first output inverter circuitry, the first p-channel pull-up transistor and the first n-channel pull-down transistor can be selectively activated to adjust a p-type to n-type beta ratio of the first output inverter circuitry; and a second output circuit coupled to the second output node of the latch circuit, the second output circuit comprises first and second series connected output inverters, a first p-channel pull-up transistor coupled to an input node of the first output inverter, an n-channel pull-down transistor coupled to an output node of the first output inverter, and a second p-channel pull-up transistor coupled to an output node of the second output inverter, the p-channel pull-up transistors and the n-channel pull-down transistor can be selectively activated to adjust a p-type to n-type beta ratio of the second output circuit.

17. A memory device comprising:

an array of memory cells;

a clock input for receiving a clock signal; and a clock input buffer comprising:
an input node for receiving a clock signal;
a controllable inverter circuit coupled to the input node, the controllable inverter circuit provides an output signal in response to the clock signal when an enable signal is in a first state, and the controllable inverter circuit is disabled when the enable signal is in a second state;
a one-shot latch circuit comprising,
a latch circuit comprising a first input node coupled to an output node of the controllable inverter circuit, a second input node, and first and second output nodes,
a delayed feedback circuit coupled between the first output node of the latch circuit and the second input node of the latch circuit;
a first output circuit coupled to the first output node of the latch circuit; and
a second output circuit coupled to the second output node of the latch circuit, the first and second output circuits have adjustable trip points to quickly detect both rising and falling output signals provided on the first and second output nodes of the latch circuit.

18. The memory device of claim 17 wherein the latch circuit comprises a pair of cross-coupled NAND gates.

19. The memory device of claim 18 wherein the delayed feedback circuit comprises:

a delay element having an input node coupled to the first output node of the latch circuit; and an inverting logic gate having an input node coupled to an output node of the delay element, an output node of the inverting logic gate is coupled to the second input node of the latch circuit.

20. The memory device of claim 19 wherein the inverting logic gate is a NOR gate.

21. The memory device of claim 17 wherein the controllable inverter circuit comprises:

p-channel pull-up transistors; and n-channel pull-down transistors coupled in series with the p-channel pull-up transistors, at least one of the p-channel pull-up transistors or n-channel pull-down transistors is selectively activated in response to the enable signal.

22. The memory device of claim 21 wherein the controllable inverter circuit further comprises a disable transistor coupled to the first input node of the latch circuit, the disable transistor is selectively activated in response to the enable signal.

23. The memory device of claim 17 wherein the first output circuit comprises output inverter circuitry that has an adjustable p-type to n-type beta ratio to establish a trip point for the first output circuit.

24. The memory device of claim 23 wherein the first output circuit comprises:

a p-channel pull-up transistor coupled to an input node of the output inverter circuitry; and an n-channel pull-down transistor coupled to an output node of the output inverter circuitry, the p-channel pull-up transistor and the n-channel pull-down transistor can be selectively activated to adjust the p-type to n-type beta ratio of the output inverter circuitry.

25. The memory device of claim 17 wherein the second output circuit comprises output inverter circuitry that has an adjustable p-type to n-type beta ratio to establish a trip point for the first output circuit.

26. The memory device of claim 25 wherein the first output circuit comprises:

a p-channel pull-up transistor coupled to an output node of the output inverter circuitry; and an n-channel pull-down transistor coupled to an input node of the output inverter circuitry, the p-channel pull-up transistor and the n-channel pull-down transistor can be selectively activated to adjust the p-type to n-type beta ratio of the inverter circuitry.

27. The memory device of claim 17 wherein the second output circuit comprises first and second series connected output inverters.

28. The memory device of claim 27 wherein the first output circuit comprises:

a first p-channel pull-up transistor coupled to an input node of the first output inverter;

an n-channel pull-down transistor coupled to an output node of the first output inverter; and a second p-channel pull-up transistor coupled to an output node of the second output inverter, the p-channel pull-up transistors and the n-channel pull-down transistor can be selectively activated to adjust a p-type to n-type beta ratio of the second output circuit.

* * * * *